(12) United States Patent
Watanabe

(10) Patent No.: US 10,573,373 B1
(45) Date of Patent: Feb. 25, 2020

(54) SERIALIZER

(71) Applicant: MICRON TECHNOLOGY, INC., Boise, ID (US)

(72) Inventor: Kenichi Watanabe, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/368,728

(22) Filed: Mar. 28, 2019

(51) Int. Cl.
*G11C 11/4093* (2006.01)
*G11C 11/4076* (2006.01)
*H03K 19/094* (2006.01)
*H03M 9/00* (2006.01)

(52) U.S. Cl.
CPC ...... *G11C 11/4093* (2013.01); *G11C 11/4076* (2013.01); *H03K 19/09429* (2013.01); *H03M 9/00* (2013.01)

(58) Field of Classification Search
None
See application file for complete search history.

(56) References Cited

U.S. PATENT DOCUMENTS 8,004,330 B1 * 8/2011 Acimovic ........ H03K 19/00361
327/108

* cited by examiner

*Primary Examiner* — Jeffery S Zweizig
(74) *Attorney, Agent, or Firm* — Dorsey & Whitney LLP

(57) ABSTRACT

Disclosed herein is an apparatus that includes an output signal line, and first and second tristate buffer circuits each having an output node connected to the output signal line in common. The output signal line includes a first section having first and second connection points, a second section having third and fourth connection points, a third section connected between the first and third connection points, and a fourth section connected between second and fourth connection points. At least a part of the first section of the output signal line is located on the first tristate buffer circuit, and at least a part of the second section of the output signal line is located on the second tristate buffer circuit.

20 Claims, 17 Drawing Sheets

SERIALIZER

BACKGROUND

A semiconductor device such as a DRAM (Dynamic Random-Access Memory) sometimes includes a parallel to serial conversion circuit that converts parallel read data into serial data, and a serial to parallel conversion circuit that converts serial write data into parallel data. The parallel to serial conversion circuit performs a parallel to serial conversion operation in synchronization with read clock signals different in phase from one another, and the serial to parallel conversion circuit performs a serial to parallel conversion operation in synchronization with write clock signals different in phase from one another. Because the frequency of data serially output from the parallel to serial conversion circuit is high, it is desirable to reduce the resistance of the output node as much as possible.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessarily mutually exclusive, as some disclosed embodiments can be combined with one or more other disclosed embodiments to form new embodiments.

Figure 1:
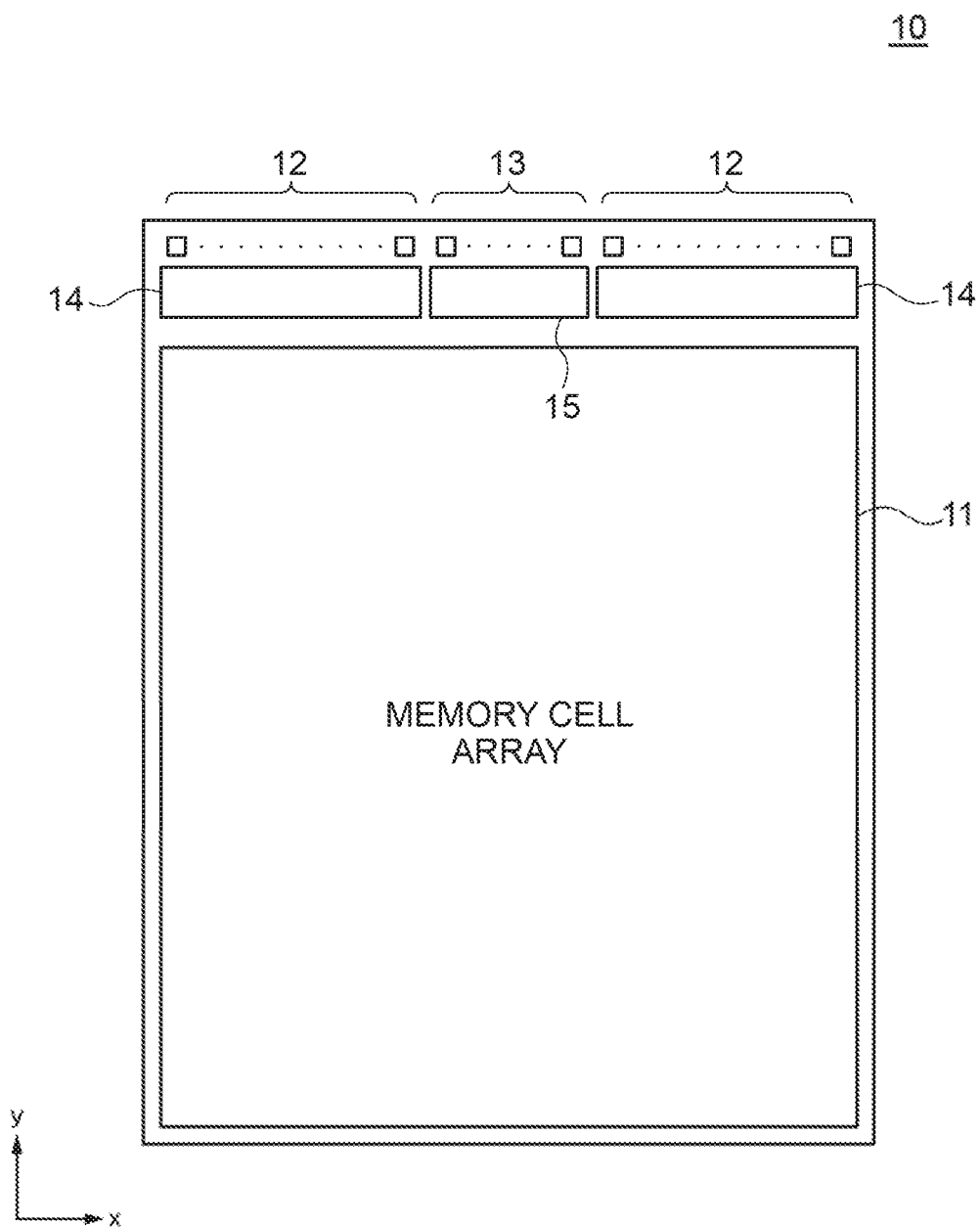
FIG. 1 is a schematic plan view showing a layout of a semiconductor device according to the present disclosure.

A semiconductor device 10 according to the present disclosure is an LPDDR5 (Low-Power Double Data Rate 5) DRAM and has a memory cell array 11, a plurality of data terminals 12, and a plurality of command address terminals 13 as shown in FIG. 1. The terminals 12 and 13 are arranged along one side extending in an x direction of the semiconductor device 10. There are also other terminals such as power terminals. The data terminals 12 are arranged in two separate locations and the command address terminals 13 are arranged therebetween. The memory cell array 11 and the data terminals 12 are connected via an I/O control circuit 14, and the memory cell array 11 and the command address terminals 13 are connected via an access control circuit 15. When read commands and address signals corresponding thereto are input from the command address terminals 13, read data that are read from the memory cell array 11 are output to the data terminals 12 via the I/O control circuit 14. When write commands and address signals corresponding thereto are input from the command address terminals 13, write data that are input to the data terminals 12 are written to the memory cell array 11 via the I/O control circuit 14.

Figure 2:
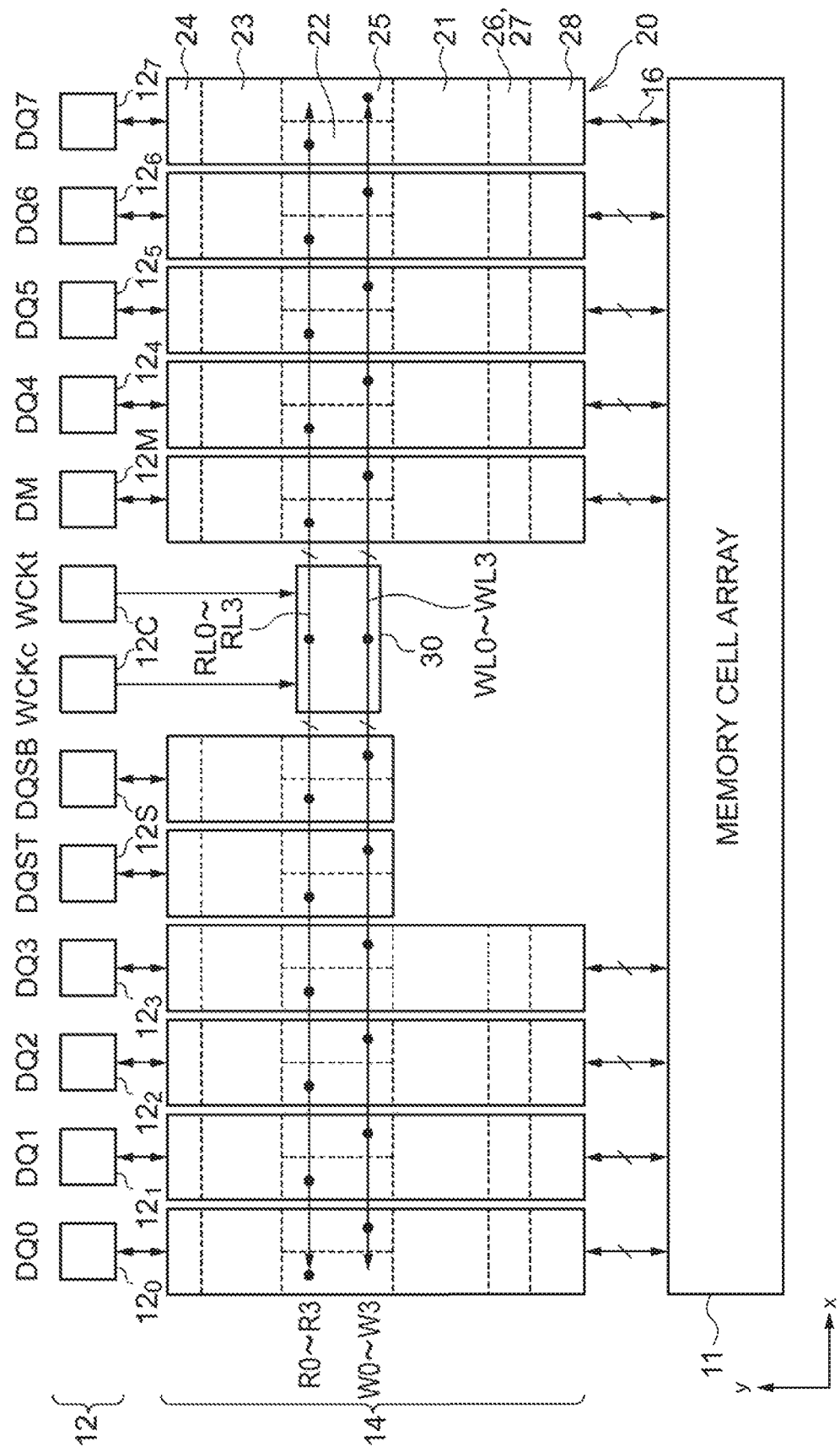
FIG. 2 is a layout diagram showing a configuration of I/O control circuits.

As shown in FIG. 2, the data terminals 12 include terminals $12_0$ to $12_7$ to and from which data DQ0 to DQ7 are input and output, respectively, a terminal 12M to and from which a data mask signal is input and output, terminals 12S to and from which complementary strobe signals DQST and DQSB are input and output, respectively, and terminals 12C to which complementary clock signals WCKt and WCKc are input, respectively. I/O control circuits 20 are respectively allocated to the terminals $12_0$ to $12_7$ and 12M. The I/O control circuits 20 are connected to the memory cell array 11 via read/write buses 16. The I/O control circuits 20 include a read-system circuit including a read data storage circuit 21, a read clock synchronization circuit (a parallel to serial conversion circuit) 22, a driver circuit 23, and an output buffer 24, and a write-system circuit including an input buffer 25, a timing adjustment circuit 26, a write clock synchronization circuit (a serial to parallel conversion circuit) 27, and a write data output circuit 28. The I/O control circuits 20 are arranged in a y direction according to the x coordinates of corresponding ones of the data terminals 12, respectively, to enable read data and write data to flow in the y direction.

Figure 3:
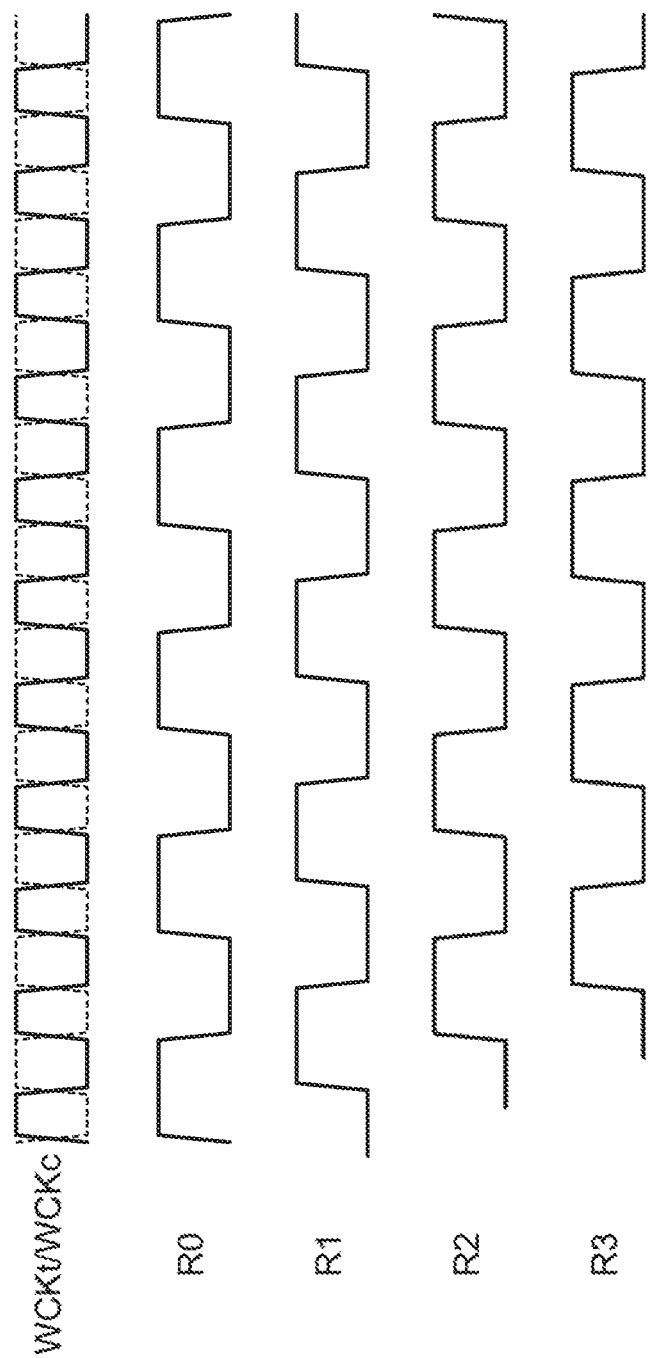
FIG. 3 is a waveform diagram of read clock signals.

The clock signals WCKt and WCKc are input to a clock signal generation circuit 30. The clock signal generation circuit 30 generates read clock signals R0 to R3 and write clock signals W0 to W3 on the basis of the clock signals WCKt and WCKc. As shown in FIG. 3, the read clock signals R0 to R3 are four-phase clock signals having a period twice as long as that of the clock signals WCKt and WCKc and are different in phase from one another by 90 degrees. The read clock signals R0 to R3 are supplied to the read clock synchronization circuit 22 via read clock lines RL0 to RL3, respectively. The read clock synchronization circuit 22 performs a parallel to serial conversion operation of read data in synchronization with the read clock signals R0 to R3. The write clock signals W0 to W3 are different in phase from one another by 90 degrees and are supplied to the input buffer 25 via write clock lines WL0 to WL3, respectively. The input buffer 25 performs a serial to parallel conversion operation of write data in synchronization with the write clock signals W0 to W3. The read clock lines RL0 to RL3 and the write clock lines WL0 to WL3 all extend in the x direction.

Figure 4:
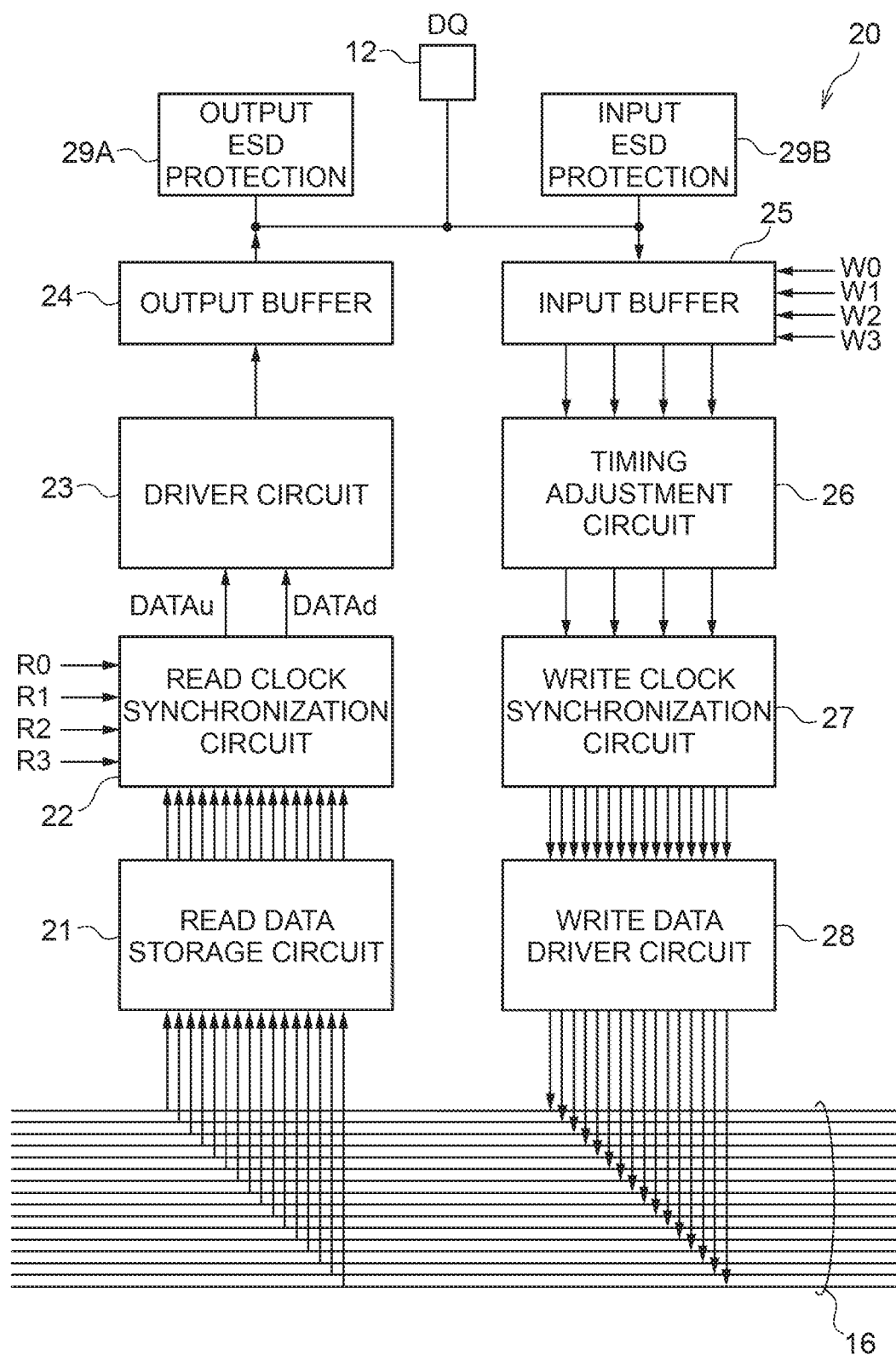
FIG. 4 is a block diagram showing a configuration of the I/O control circuits.

FIG. 4 is a block diagram showing a configuration of the I/O control circuits 20. The read data storage circuit 21, the read clock synchronization circuit 22, the driver circuit 23, and the output buffer 24 constitute the read-system circuit and are connected in this order between the read/write buses 16 and the data terminals 12. An output ESD (electrostatic discharge) protection circuit 29A is provided near the output buffer 24. The input buffer 25, the timing adjustment circuit 26, the write clock synchronization circuit 27, and the write data output circuit 28 constitute the write-system circuit and are connected in this order between the data terminals 12 and the read/write buses 16. An input ESD protection circuit 29B is provided near the input buffer 25.

The read data storage circuit 21 stores therein parallel read data supplied from the read/write buses 16 and supplies the read data to the read clock synchronization circuit 22. The read clock synchronization circuit 22 converts the parallel read data into serial data on the basis of the read clock signals R0 to R3 to generate complementary pull-up data DATAu and pull-down data DATAd. The driver circuit 23 drives the output buffer 24 on the basis of the pull-up data DATAu and the pull-down data DATAd, whereby serial write data DQ is output from the data terminals 12. The impedance, the driver strength, and the slew rate of the output buffer 24 are adjusted by the driver circuit 23.

Figure 5:
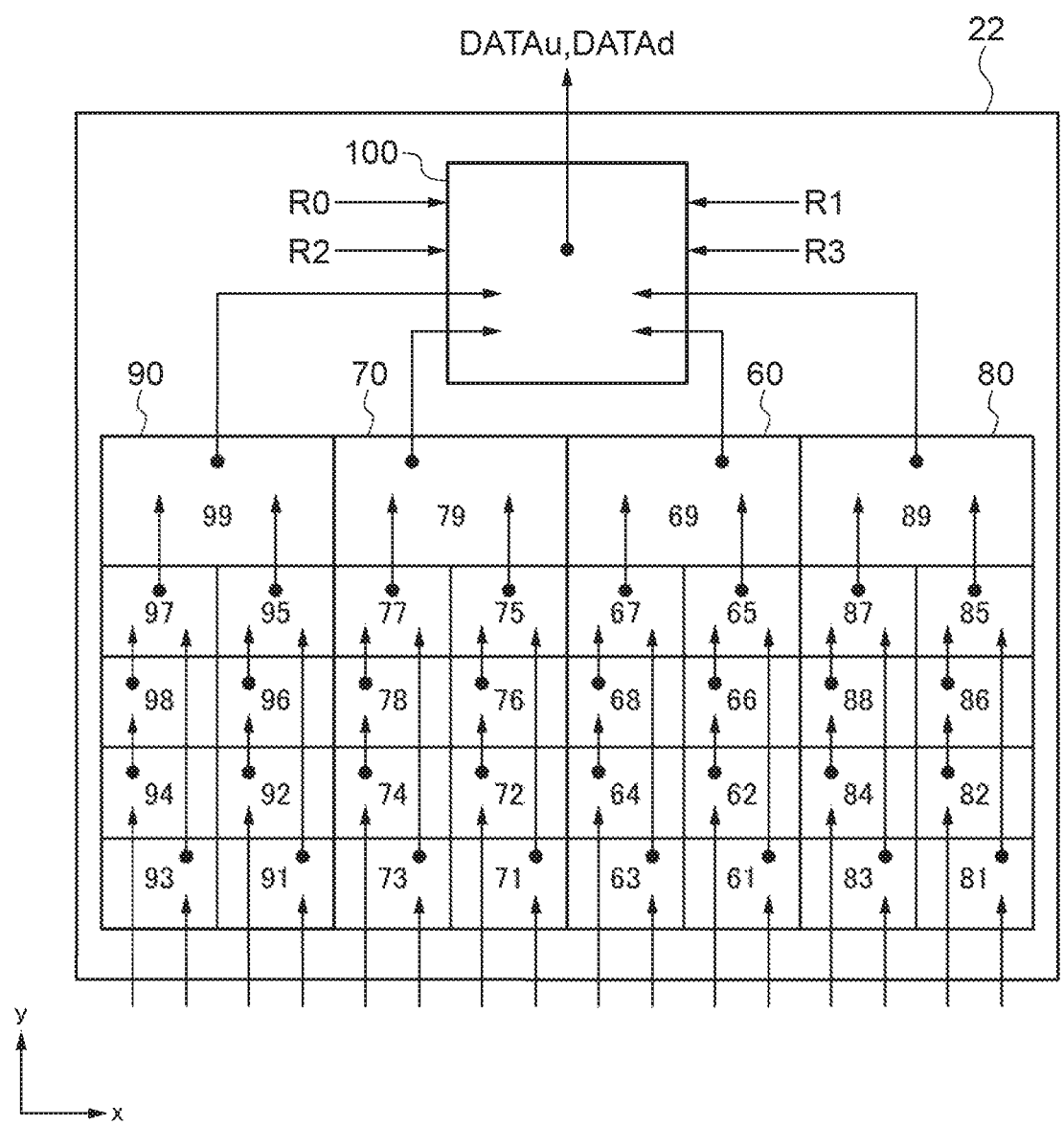
FIG. 5 is a layout diagram of a read clock synchronization circuit.
Figure 6:
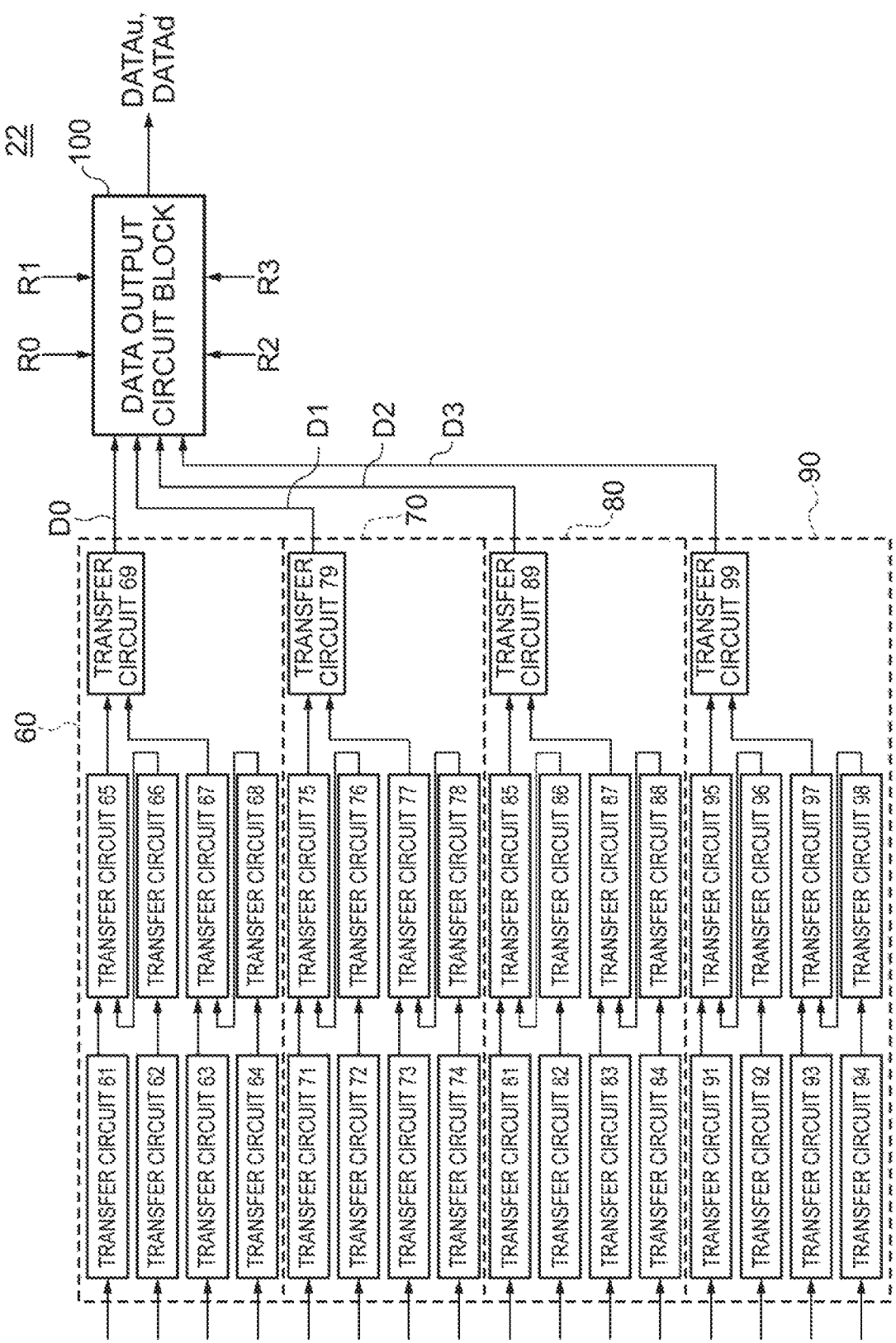
FIG. 6 is a circuit diagram of the read clock synchronization circuit.

FIG. 5 is a layout diagram of the read clock synchronization circuit 22, and FIG. 6 is a circuit diagram of the read clock synchronization circuit 22. As shown in FIGS. 5 and 6, the read clock synchronization circuit 22 includes four data transfer circuit blocks 60, 70, 80, and 90, and a data output circuit block 100. The data transfer circuit blocks 60, 70, 80 and 90 each serve a function to convert four-bit parallel read data into serial data and transfer the serial data to the data output circuit block 100. While the data transfer circuit blocks 90, 70, 60, and 80 are arranged in this order in the x direction in an example shown in FIG. 5, the layout of the data transfer circuit blocks is not limited thereto.

The data transfer circuit block 60 includes transfer circuits 61 to 69. Parallel four-bit read data input to the data transfer circuit block 60 are first input to the transfer circuits 61 to 64, respectively. Data loaded into the transfer circuits 61 to 64 are transferred to the transfer circuits 65 to 68, respectively. Data loaded into the transfer circuits 66 and 68 are transferred to the transfer circuits 65 and 67, respectively, and data transferred to the transfer circuits 65 and 67 are transferred to the data output circuit block 100 via the transfer circuit 69. Accordingly, the parallel four-bit read data are converted into serial data and are transferred as read data D0 to the data output circuit block 100. The same holds true for other data transfer circuit blocks 70, 80, and 90 and parallel four-bit read data are converted into serial data to be transferred as read data D1 to D3 to the data output circuit block 100, respectively.

Figure 7:
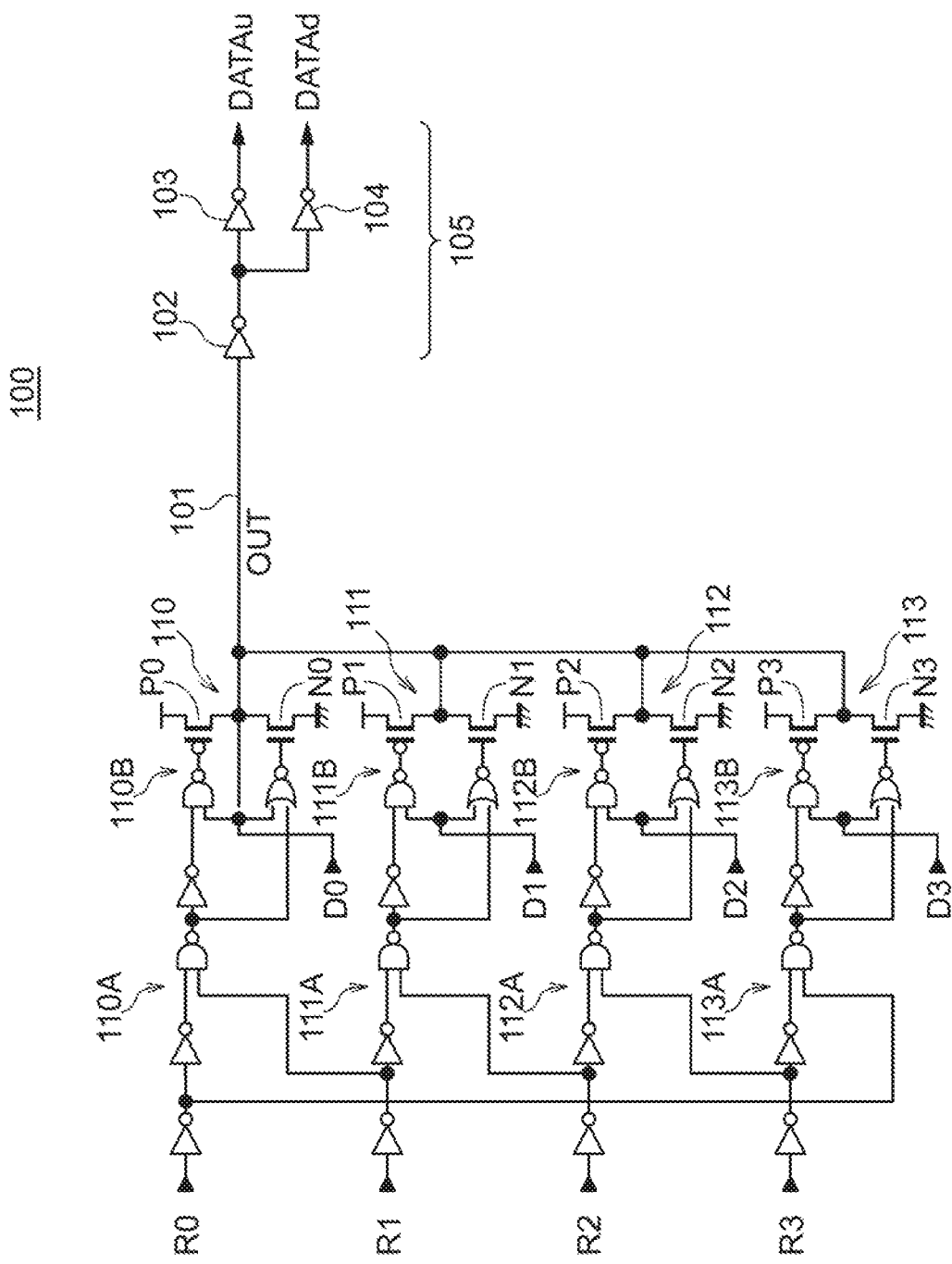
FIG. 7 is a circuit diagram of a data output circuit block.
Figure 8:
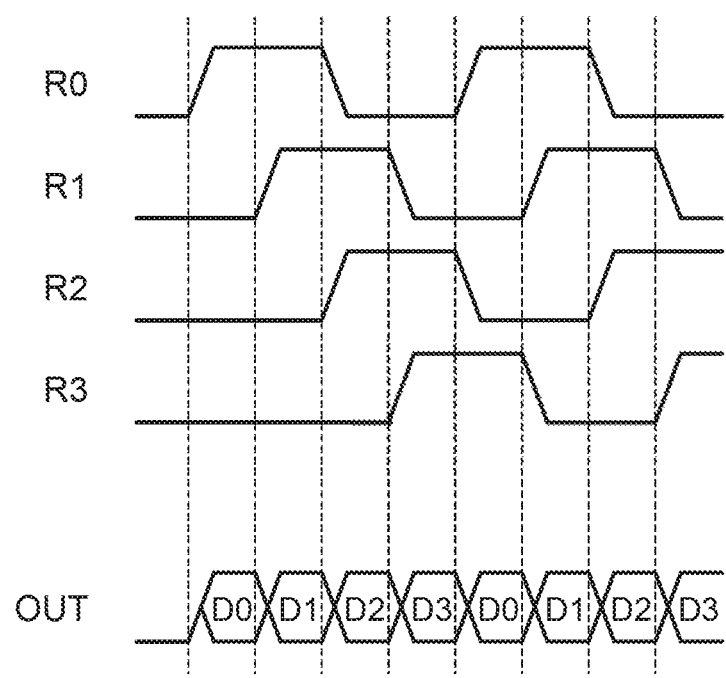
FIG. 8 is a timing diagram for explaining an operation of the data output circuit block.

FIG. 7 is a circuit diagram of the data output circuit block 100. As shown in FIG. 7, the data output circuit block 100 has four tristate buffer circuits 110 to 113. The tristate buffer circuits 110 to 113 have preceding-stage circuit parts 110A to 113A each including a plurality of logical gate circuits, and output circuit parts 110B to 113B including P-channel MOS transistors P0 to P3 and N-channel MOS transistors N0 to N3 connected in series, respectively. One of the tristate buffer circuits 110 to 113 is activated and the remaining three tristate buffer circuits have outputs in a high impedance state on the basis of the read clock signals R0 to R3. Output nodes of the tristate buffer circuits 110 to 113 are connected to a signal node 101 in common. The read clock signals R0 to R3 are four-phase clock signals different in phase from one another by 90 degrees as shown in FIG. 8. The tristate buffer circuits 110 to 113 output the read data D0 to D3 to the signal node 101 in response to rising edges of the read clock signals R0 to R3, respectively. Therefore, the frequency of the serial read data D0 to D3 appearing on the signal node 101 is four times as high as the frequency of the parallel read data D0 to D3 input to the data output circuit block 100.

A buffer circuit 105 including cascade-connected inverter circuits 102 and 103, and a buffer circuit 104 that buffers the output of the inverter circuit 102 is provided at the subsequent stage of the signal node 101. The output of the inverter circuit 103 is used as the pull-up data DATAu and the output of the buffer circuit 104 is used as the pull-down data DATAd. The pull-up data DATAu and the pull-down data DATAd are supplied to the driver circuit 23.

Figure 9:
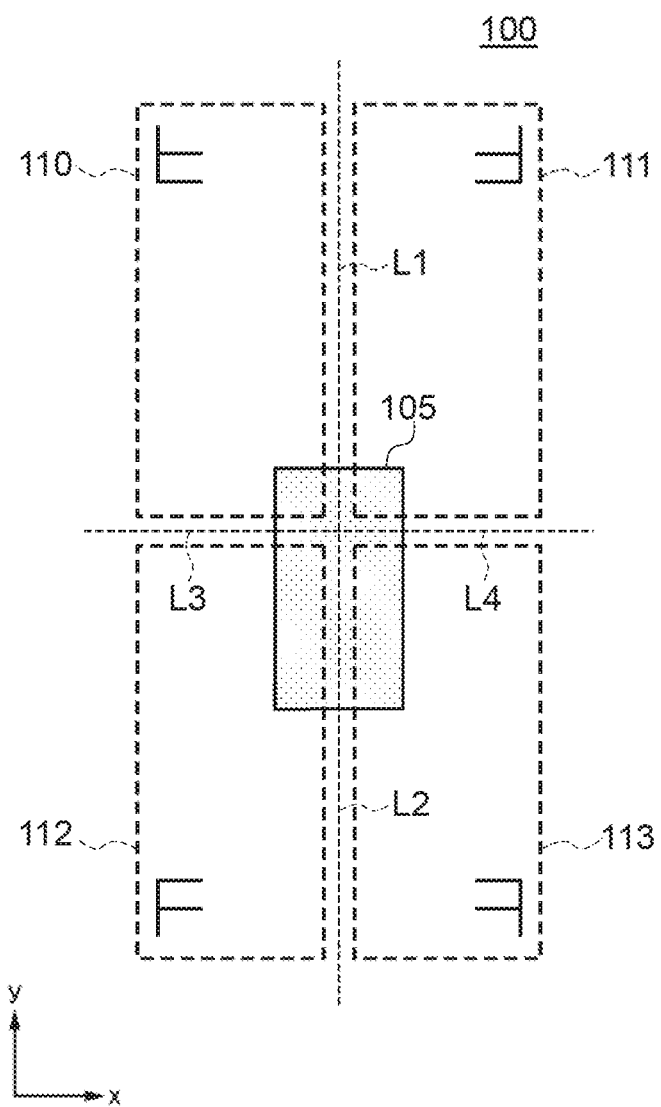
FIG. 9 is a layout diagram of the data output circuit block.

FIG. 9 is a layout diagram of the data output circuit block 100. As shown in FIG. 9, the tristate buffer circuits 110 to 113 constituting the data output circuit block 100 are laid out in a matrix manner and the buffer circuit 105 is located at a central part thereof. The tristate buffer circuit 110 and the tristate buffer circuit 111 are located adjacently in the x direction and the tristate buffer circuit 112 and the tristate buffer circuit 113 are located adjacently in the x direction. The tristate buffer circuit 110 and the tristate buffer circuit 112 are located adjacently in the y direction and the tristate buffer circuit 111 and the tristate buffer circuit 113 are located adjacently in the y direction.

Signs F shown in FIG. 9 indicate a topology of the tristate buffer circuits 110 to 113. Therefore, the tristate buffer circuit 110 and the tristate buffer circuit 111 are line-symmetric with respect to a symmetry axis L1, and the tristate buffer circuit 112 and the tristate buffer circuit 113 are line-symmetric with respect to a symmetry axis L2. The symmetry axis L1 and the symmetry axis L2 are positioned on a same line extending in the y direction. Further, the tristate buffer circuit 110 and the tristate buffer circuit 112 are line-symmetric with respect to a symmetry axis L3, and the tristate buffer circuit 111 and the tristate buffer circuit 113 are line-symmetric with respect to a symmetry axis L4. The symmetry axis L3 and the symmetry axis L4 are positioned on a same line extending in the x direction.

Figure 10:
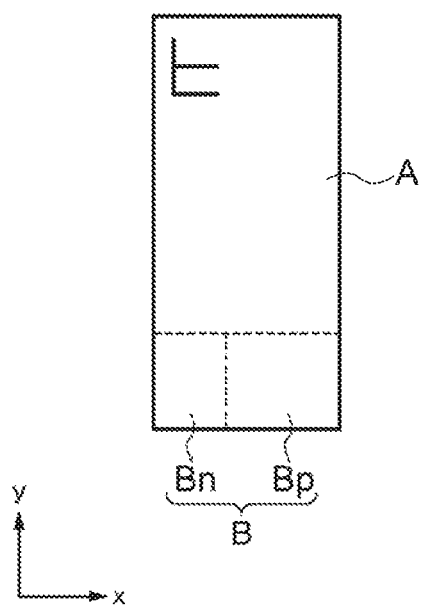
FIG. 10 is a layout diagram of a tristate buffer circuit.

FIG. 10 is a layout diagram of the tristate buffer circuit 110. As shown in FIG. 10, the tristate buffer circuit 110 is laid out in a region A where the preceding-stage circuit part 110A is placed and a region B where the output circuit part 110B is placed. The region A and the region B are adjacent in the y direction. The region B includes a region Bp where the transistor P0 is placed and a region Bn where the transistor N0 is placed, and is laid out in such a manner that the regions Bp and Bn are adjacent in the x direction. The same holds true for other tristate buffer circuits 111 to 113.

Figure 11:
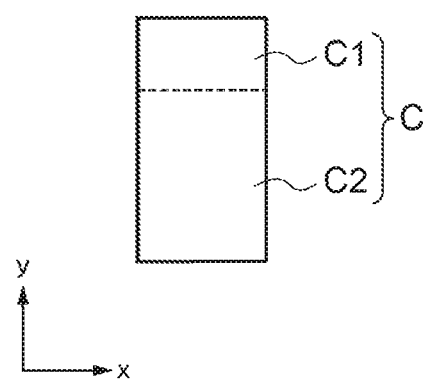
FIG. 11 is a layout diagram of a buffer circuit.

FIG. 11 is a layout diagram of the buffer circuit 105. As shown in FIG. 11, the buffer circuit 105 is laid out in a region C1 where the inverter circuit 102 is placed and a region C2 where the inverter circuit 103 connected at the subsequent stage of the inverter 102 and the buffer circuit 104 are placed. The region C1 and the region C2 are adjacent in the y direction.

Figure 12:
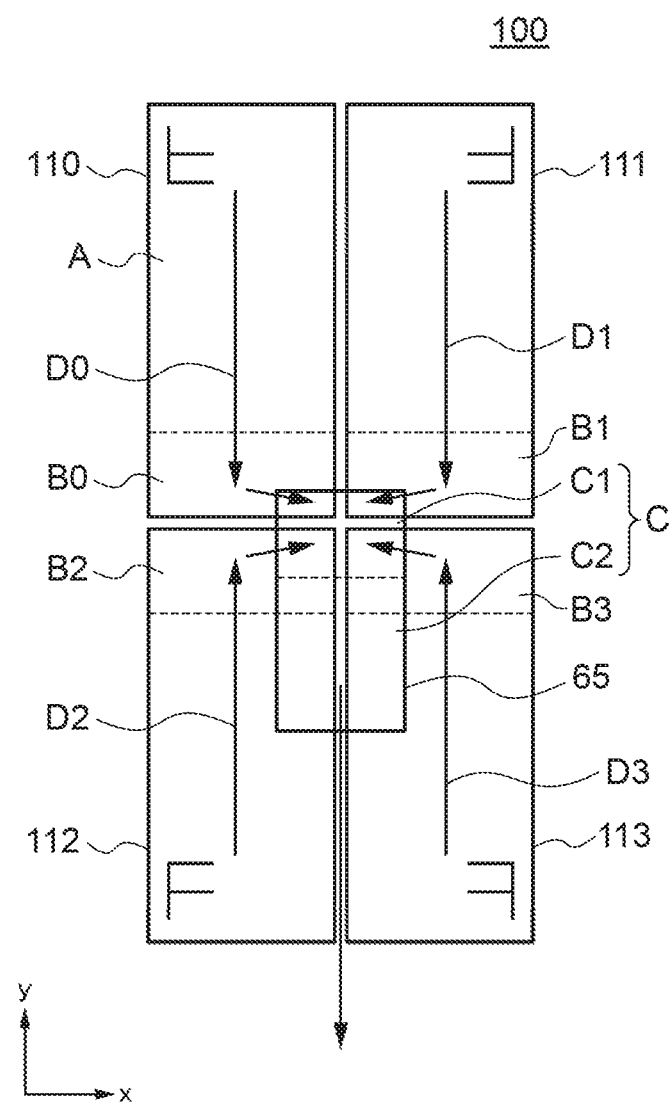
FIG. 12 is a diagram for explaining flows of data in the data output circuit block.

FIG. 12 is a diagram for explaining flows of the data D0 to D3 in the data output circuit block 100. Given that, as shown in FIG. 12, the tristate buffer circuits 110 to 113 are laid out in a matrix manner and adjacent two of the tristate buffer circuits are line-symmetric, the regions B0 to B3 where the output circuits parts 110B to 113B are respectively placed are arranged. That is, the data D0 and D1 flow in the tristate buffer circuits 110 and 111 in the y direction from an upper side to a lower side of the drawing and further flow in the x direction from the regions B0 and B1 to the region C1, respectively. Meanwhile, in the tristate buffer circuits 112 and 113, the data D2 and D3 flow in the y direction from a lower side to an upper side of the drawing and further flow in the x direction from the regions B2 and B3 to the region C1, respectively. Therefore, the line lengths of lines connecting the output circuit parts 110B to 113B respectively arranged in the regions B0 to B3, and the inverter circuit 102 located in the region C1 can be respectively minimized, and also the respective line lengths can be almost matched among the tristate buffer circuits 110 to 113. The inverter circuit 103 and the buffer circuit 104 located in the region C2 are arranged to be sandwiched by the preceding-stage circuit part 112A included in the tristate buffer circuit 112 and the preceding-stage circuit pan 113A included in the tristate buffer circuit 113.

Figure 13:
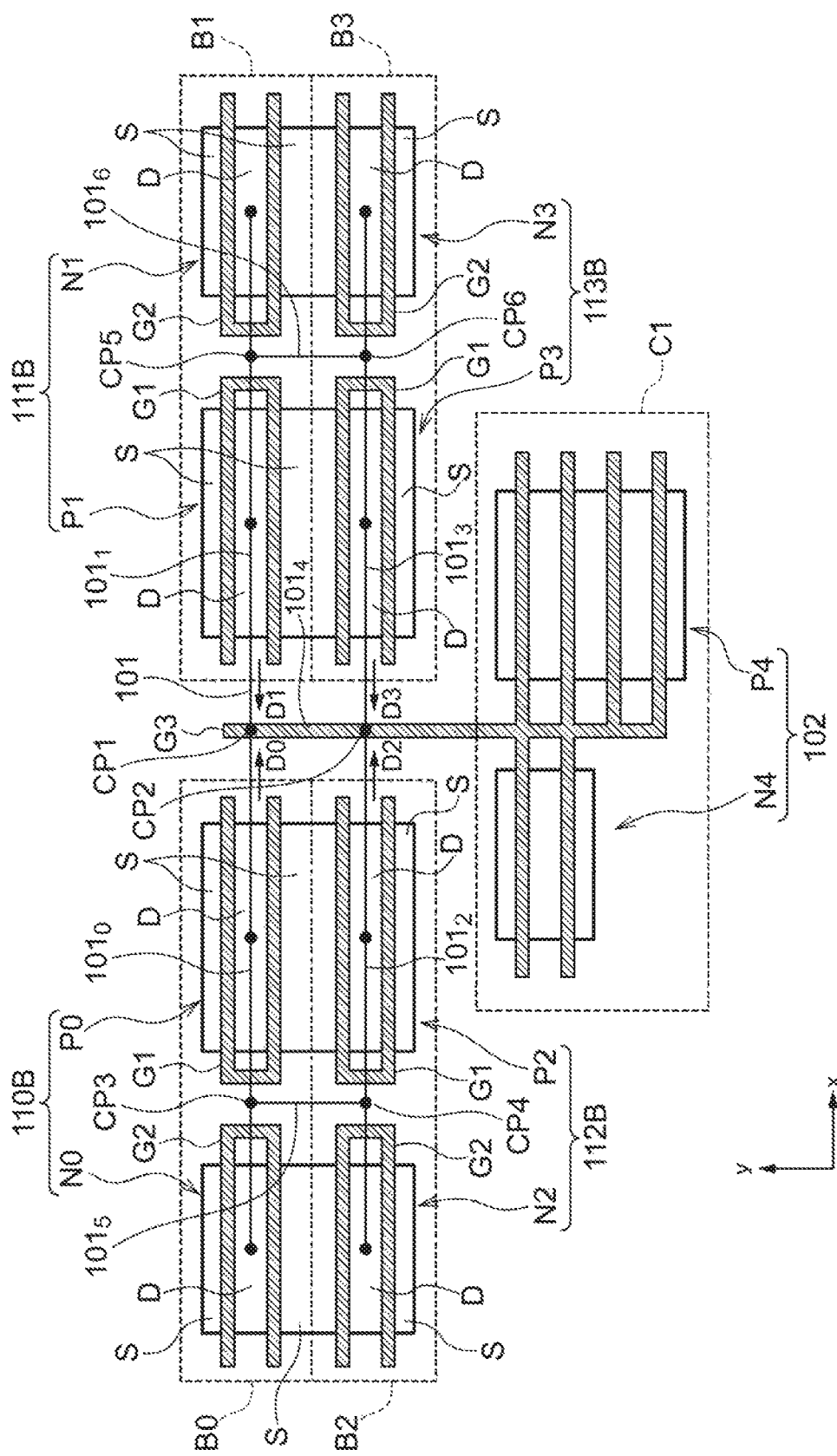
FIG. 13 is a plan view showing the layout of the data output circuit block in more detail.

FIG. 13 is a plan view showing the layout of the regions B and C in more detail. As shown in FIG. 13, the output circuit parts 110B to 113B arranged in the region B include the transistors P0 to P3 and N0 to N3, respectively. Signs G1 shown in FIG. 13 denote gate electrodes of the transistors P0 to P3 and signs G2 denote gate electrodes of the transistors N0 to N3. Drains D of the transistors P0 to P3 and N0 to N3 are connected to the signal node 101 in common. The signal node 101 is connected to a gate electrode G3 of transistors P4 and N4 constituting the inverter circuit 102. The output circuit parts 110B and 111B respectively included in the tristate buffer circuits 110 and 111 are laid out line-symmetrically with respect to the symmetry axis L1 shown in FIG. 9, the output circuit parts 112B and 113B respectively included in the tristate buffer circuits 112 and 113 are laid out line-symmetrically with respect to the symmetry axis L2 shown in FIG. 9, the output circuit parts 110B and 112B respectively included in the tristate buffer circuits 110 and 112 are laid out line-symmetrically with respect to the symmetry axis L3 shown in FIG. 9, and the output circuit parts 111B and 113B respectively included in the tristate buffer circuits 111 and 113 are laid out line-symmetrically with respect to the symmetry axis IA shown in FIG. 9. The transistors P0 and P2 respectively included in the tristate buffer circuits 110 and 112 share a source region S, the transistors N0 and N2 respectively included in the tristate buffer circuits 110 and 112 share a source region S, the transistors P1 and P3 respectively included in the tristate buffer circuits 111 and 113 share a source region S, and the transistors N1 and N3 respectively included in the tristate buffer circuits 111 and 113 share a source region S.

The signal node 101 includes a section $101_0$ located at a position overlapping with the transistors P0 and N0, a section $101_1$ located at a position overlapping with the transistors P1 and N1, a section $101_2$ located at a position overlapping with the transistors P2 and N2, and a section $101_3$ located at a position overlapping with the transistors P3 and N3. These sections $101_0$ to $101_3$ all extend in the x direction. An end of the section $101_0$ and an end of the section $101_1$ are connected to each other at a first connection point CP1, and an end of the section $101_2$ and an end of the section $101_3$ are connected to each other at a second connection point CP2. The signal node 101 further has a section $101_4$ connecting the first connection point CP1 and the second connection point CP2 to each other.

The section $101_0$ has a third connection point CP3 located on the opposite side to the first connection point CP1 with respect to the transistor P0 and located between the transistors P0 and N0. The section $101_2$ has a fourth connection point CP4 located on the opposite side to the second connection point CP2 with respect to the transistor P2 and located between the transistors P2 and N2. The section $101_1$ has a fifth connection point CP5 located on the opposite side to the first connection point CP1 with respect to the transistor P1 and located between the transistors P1 and N1. The section $101_3$ has a sixth connection point CP6 located on the opposite side to the second connection point CP2 with respect to the transistor P3 and located between the transistors P3 and N3. The signal node 101 further includes a section $101_5$ connecting the third connection point CP3 and the fourth connection point CP4 to each other, and a section $101_6$ connecting the fifth connection point CP5 and the sixth connection point CP6 to each other. The sections $101_4$ to $101_6$ all extend in the y direction.

Figure 14:
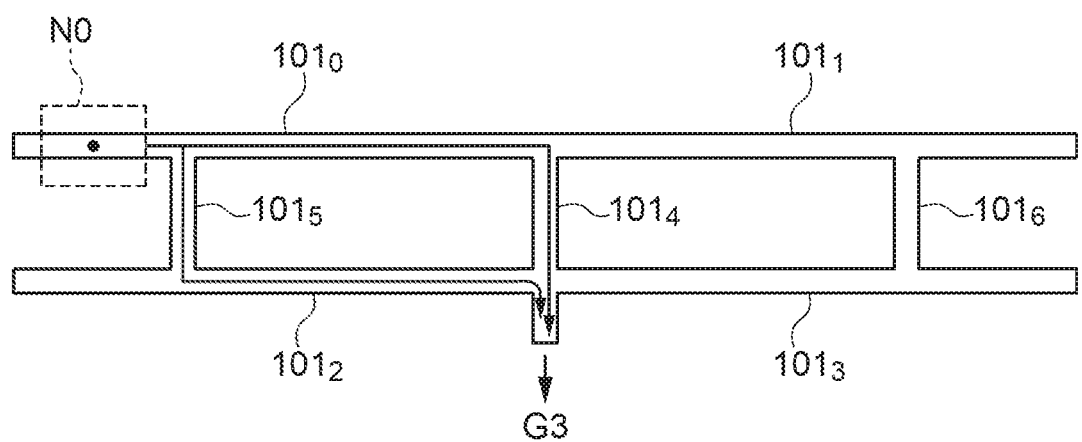
FIG. 14 is a schematic diagram for explaining a flow of data on a signal node.

Accordingly, as shown in FIG. 14, for example, in a case where the transistor N0 included in the tristate buffer circuit 110 is turned ON, the output signal is supplied to the gate electrode G3 not only via the sections $101_0$ and $101_4$ of the signal node 101 but also via the sections $101_5$ and $101_2$, so that the line resistance is lowered. The same holds true for cases where the transistors N1 to N3 respectively included in the tristate buffer circuits 111 to 113 are turned ON. Therefore, delay of the data D0 to D3 occurring on the signal node 101 is reduced, which is more advantageous for a high-speed operation of the circuits. Furthermore, the signal paths of the data D0 to D3 output from the tristate buffer circuits 110 to 113 to the inverter circuit 102 are shortest and uniform. That is the line lengths from the output circuit parts 110B to 113B respectively included in the tristate buffer circuits 110 to 113 to the gate electrode G3 of the transistors P4 and N4 constituting the inverter circuit 102 are equal to each other and there is almost no difference in the circuit condition. Therefore, a high data transfer rate can be realized. The section $101_5$ is located between the transistors P0, P2 and the transistors N0, N2, and the section $101_6$ is located between the transistors P1, P3 and the transistors N1, N3. Although not shown in the drawings, this configuration is provided to avoid short circuit with a line for a pull-up power source extending on the source region S of the transistors P0 to P3 and a line for a pull-down power source extending on the source region S of the transistors N0 to N3. Alternatively, by removing a part of the power source on one or both of the source regions S in the layout, the section $101_5$ and the section $101_6$ can be displaced onto the source regions S or an additional section can be provided on the source regions S.

Figure 15:
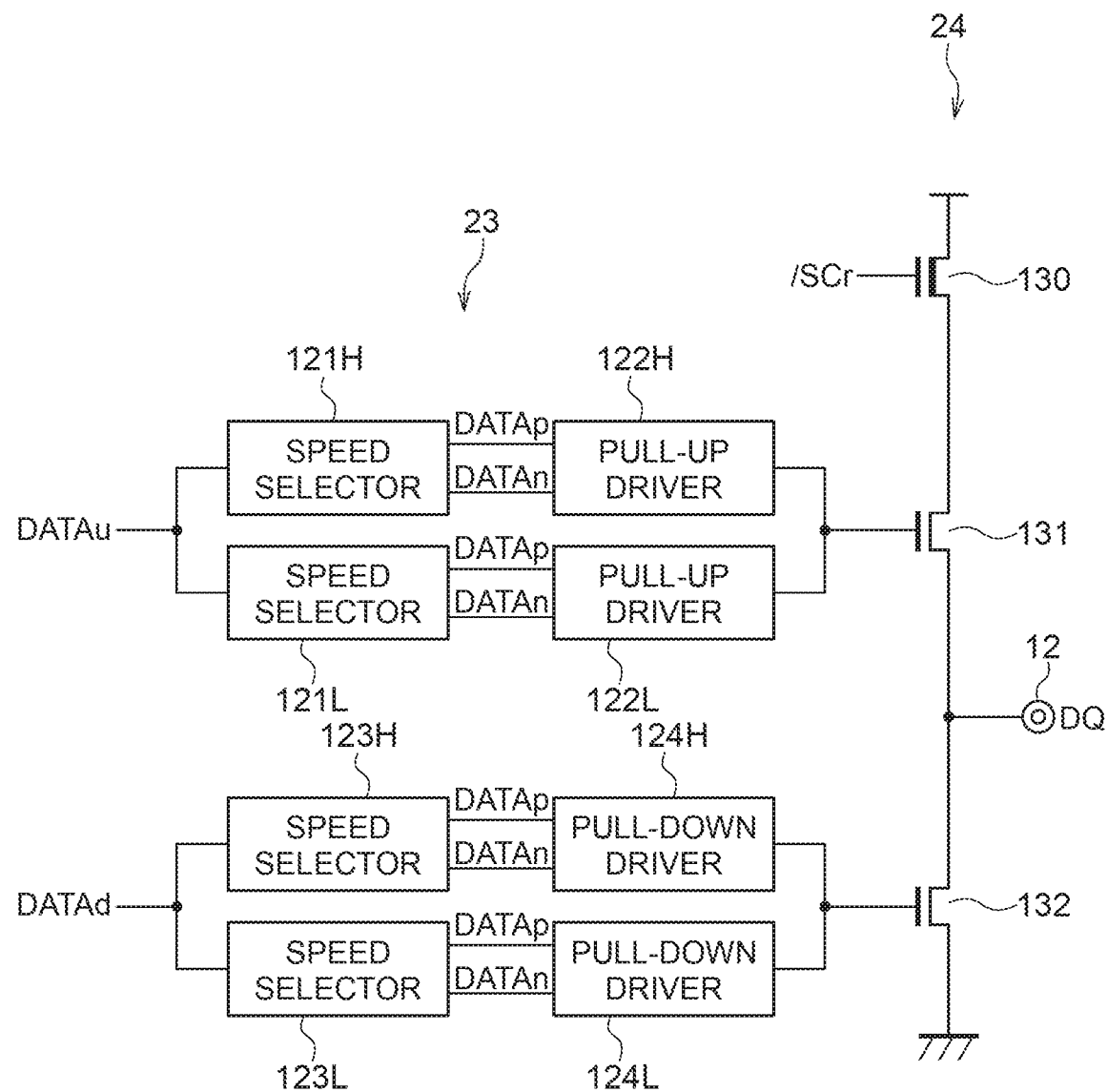
FIG. 15 is a circuit diagram of a driver circuit and an output buffer.

FIG. 15 is a circuit diagram of the driver circuit 23 and the output buffer 24. The driver circuit 23 has speed selectors 121H and 121L that receive the pull-up data DATAu, and speed selectors 123H and 123L that receive the pull-down data DATAd. The speed selectors 121H and 123H are activated when a high-speed mode is selected, and generate data signals DATAp, DATAn on the basis of the pull-up data DATAu and the pull-down data DATAd, respectively. The data signals DATAp, DATAn output from the speed selectors 121H and 123H are supplied to a pull-up driver 122H and a pull-down driver 124H, respectively. The speed selectors 121L and 123L are activated when a low-speed mode is selected, and generate the data signals DATAp, DATAn on the basis of the pull-up data DATAu and the pull-down data DATAd, respectively. The data signals DATAp, DATAn output from the speed selectors 121L and 123L are supplied to a pull-up driver 122L and a pull-down driver 124L, respectively.

The output buffer 24 includes a switch transistor 130, an output transistor 131, and an output transistor 132 connected in series. The switch transistor 130 is an N-channel MOS transistor having a thickened gate dielectric film, and a reset signal /SCr is supplied to a gate electrode thereof. The reset signal /SCr becomes a high level at the time of a read operation. Outputs of the pull-up drivers 122H and 122L are wired-OR connected to be supplied to a gate electrode of the transistor 131. Outputs of the pull-down drivers 124H and 124L are wired-OR connected to be supplied to a gate electrode of the transistor 132.

Figure 16:
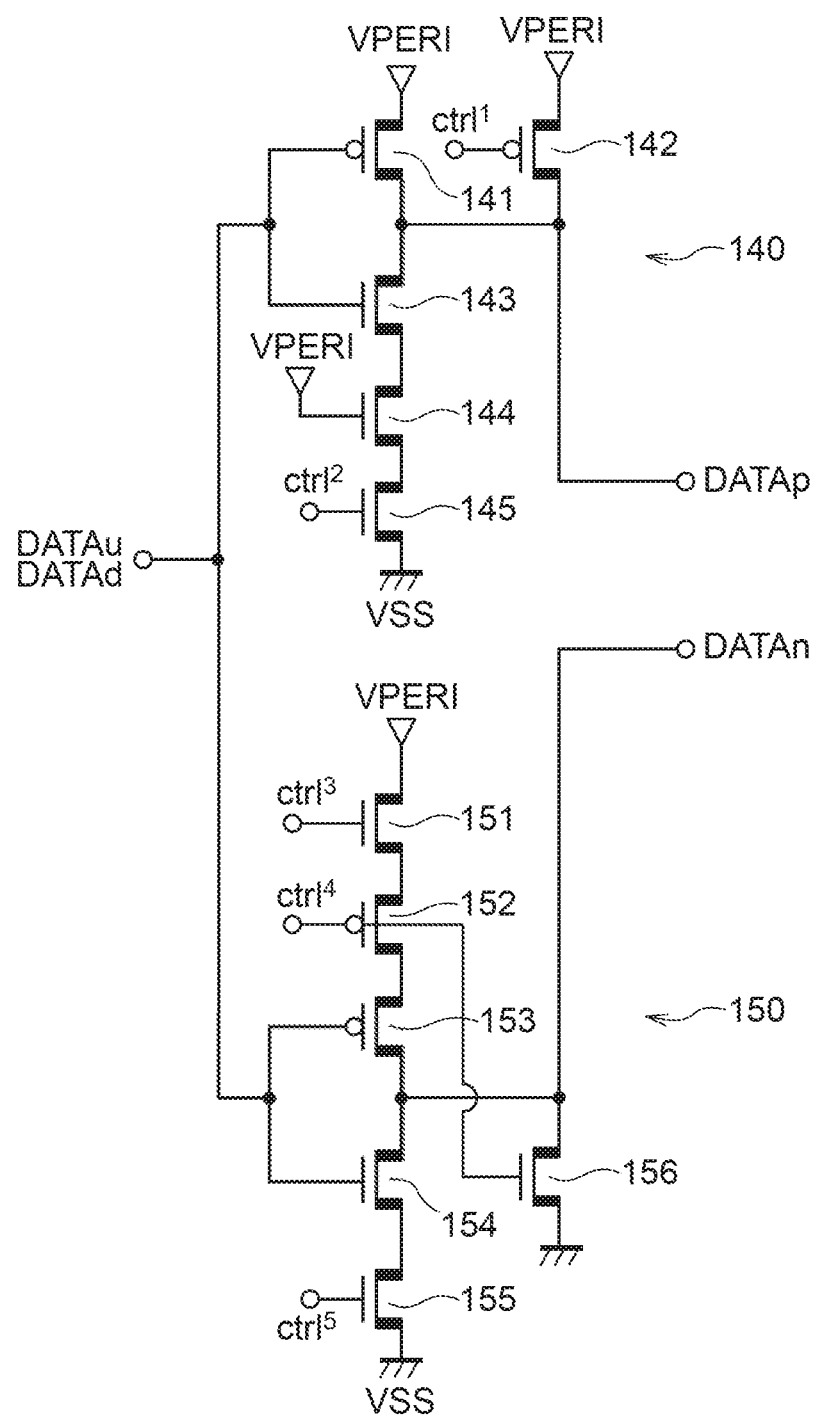
FIG. 16 is a circuit diagram of speed selectors.

FIG. 16 is a circuit diagram of the speed selectors. Each of the speed selectors includes a NAND gate circuit 140 and a NOR gate circuit 150. The NAND gate circuit 140 generates the data signal DATAp on the basis of the pull-up data DATAu or the pull-down data DATAd and control signals $ctrl^1$ and $ctrl^2$. High-speed transistors having a lowered threshold voltage are used as transistors 141 to 145 constituting the NAND gate circuit 140. The NOR gate circuit 150 generates the data signal DATAn on the basis of the pull-up data DATAu or the pull-down data DATAd and control signals $ctrl^3$ to $ctrl^5$. High-speed transistors having a lowered threshold voltage are used also as transistors 151 to 156 constituting the NOR gate circuit 150. The control signals $ctrl^1$ to $ctrl^5$ are a speed mode signal, a timing signal, a non-target ODT (on-die termination) enable signal, or a signal obtained by a logic synthesis of these signals.

Figure 17:
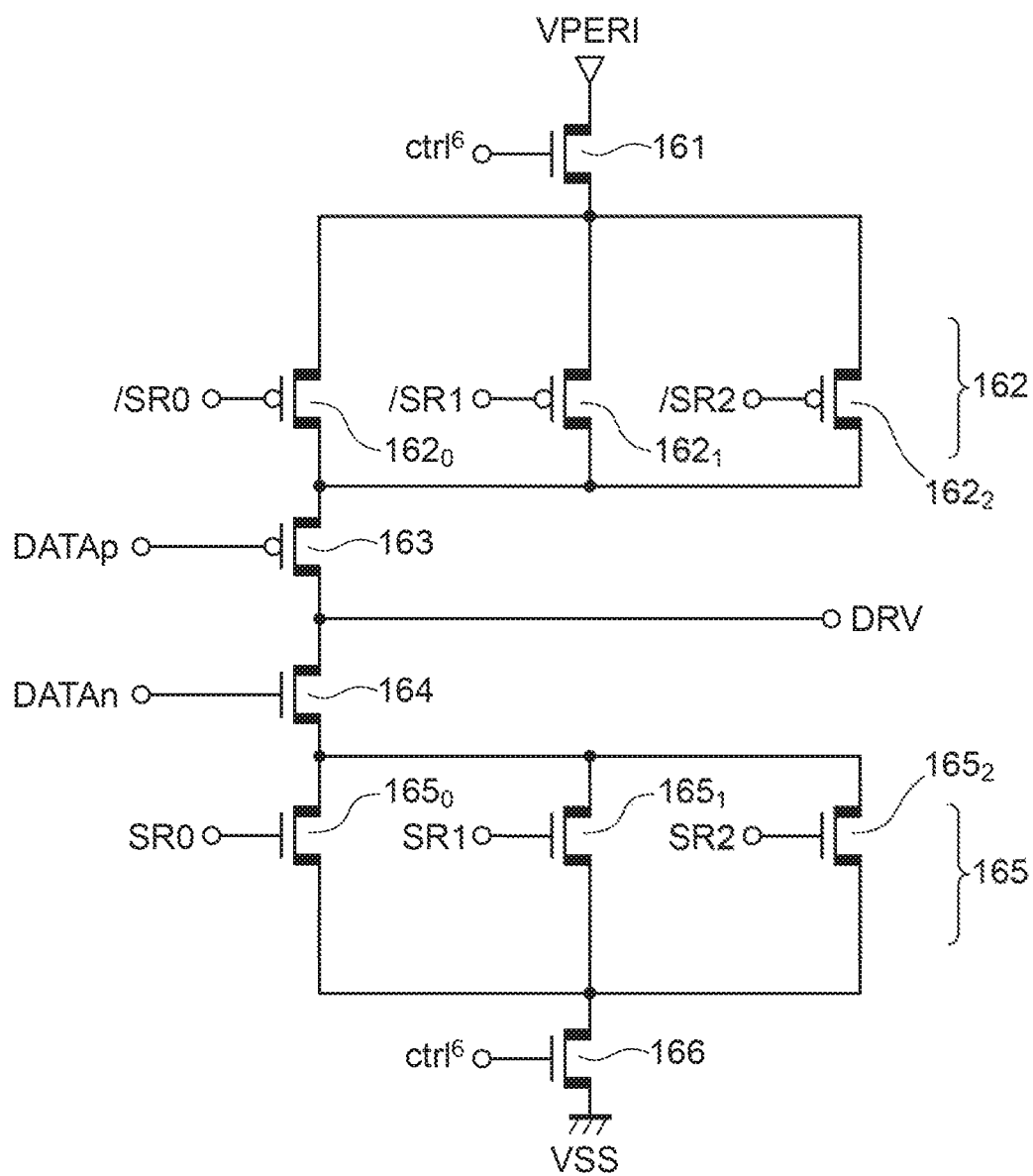
FIG. 17 is a circuit diagram of a pull-up driver or a pull-down driver.

FIG. 17 is a circuit diagram of the pull-up driver or the pull-down driver. The pull-up driver or the pull-down driver is a tristate buffer having transistors 161 to 166 connected in series, and a drive signal DRV is output from a connection point between the transistor 163 and the transistor 164. The data signal DATAp is supplied to a gate electrode of the transistor 163 and the data signal DATAn is supplied to a gate electrode of the transistor 164. The transistors 161 and 166 are transistors for activating the relevant pull-up driver or pull-down driver, and a control signal $ctrl^6$ obtained by a logic synthesis of the speed mode signal and the timing signal is input to gate electrodes thereof. The transistors 161 and 166 can be high-voltage transistors having a thickened gate dielectric film. When the transistors 161 and 166 are turned OFF, the relevant pull-up driver or pull-down driver is deactivated and the output node thereof becomes a high impedance state. The transistor 162 is constituted by a plurality of transistors $162_0$ to $162_2$ connected in parallel and the transistor 165 is constituted by a plurality of transistors $165_0$ to $165_2$ connected in parallel. Inverted signals of bits SR0 to SR2 (e.g., /SR0 to/SR2) constituting a slew rate code signal SR are supplied to gate electrodes of the transistors $162_0$ to $162_2$, respectively. The bits SR0 to SR2 constituting the slew rate code signal SR are supplied to gate electrodes of the transistors $165_0$ to $165_2$, respectively. The slew rate code signal SR can include impedance code information.

Figure 18:
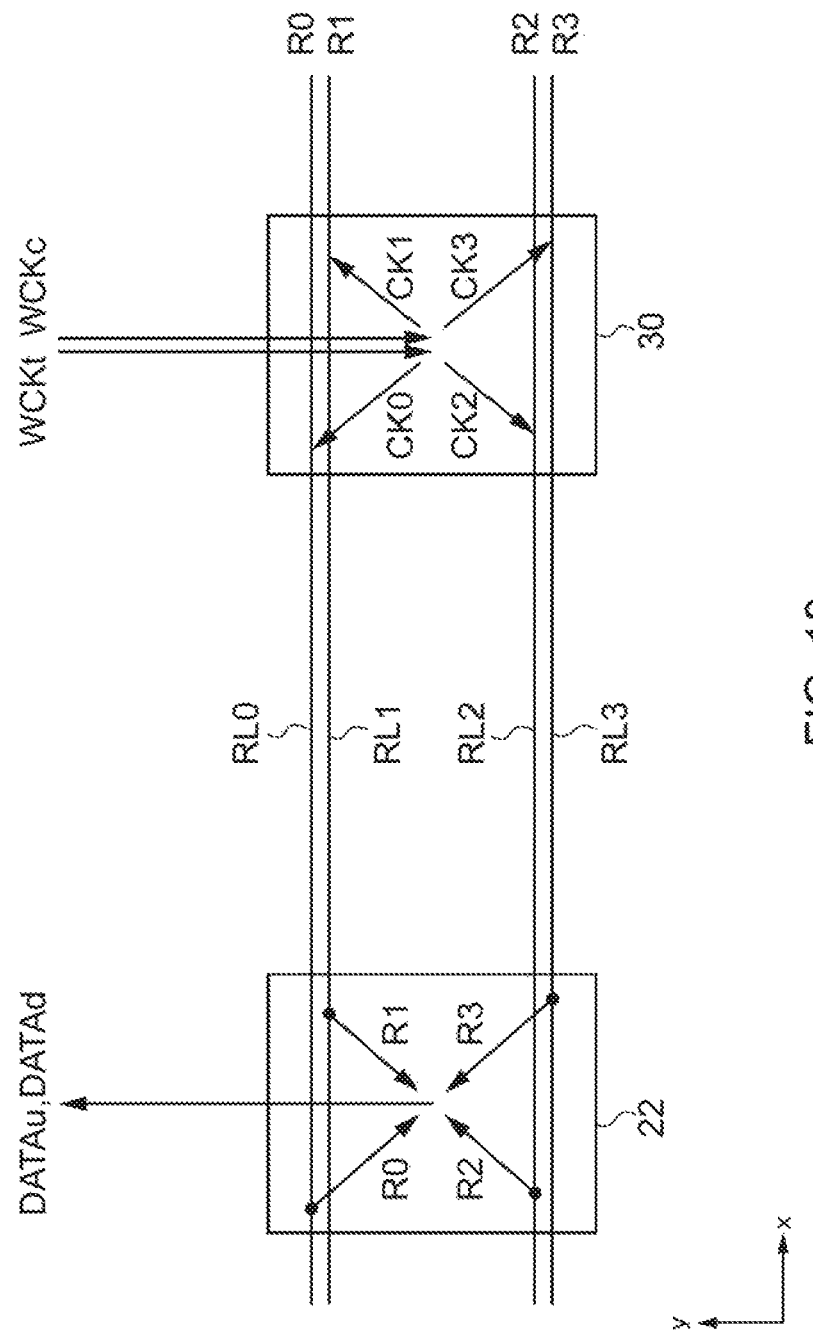
FIG. 18 is a schematic diagram for explaining flows of divided clock signals and read clock signals.

With this configuration, one of the transistors 131 and 132 constituting the output buffer 24 is turned ON on the basis of the pull-up data DATAu and the pull-down data DATAd and the read data DQ of a high level or a low level is output from the data terminals 12 at the time of a read operation. The semiconductor device 10 according to the present disclosure inputs the clock signals WCKt and WCKc supplied from outside to a substantially central part of the clock signal generation circuit 30, and radially outputs four-phase divided clock signals CK0 to CK3 on the basis of the clock signals WCKt and WCKc as shown in FIG. 18. The read clock signals R0 to R3 generated on the basis of the divided clock signals CK0 to CK3 are transmitted via the read clock lines RL0 to RL3 extending in the x direction and are supplied to the read clock synchronization circuit 22. The read clock synchronization circuit 22 centralizes the read clock signals R0 to R3 and performs a parallel to serial conversion operation on the basis of the read clock signals R0 to R3, thereby generating the pull-up data DATAu and the pull-down data DATAd.

On the other hand, at the time of a write operation, the write data DQ input to the data terminals 12 is supplied to the input buffer 25. The input buffer 25 converts the serial write data DQ into parallel four-bit write data DQ on the basis of the write clock signals W0 to W3. The timings of the parallel four-bit write data DQ are adjusted by the timing adjustment circuit 26. Thereafter, the parallel four-bit write data DQ are further converted into parallel 16-bit write data DQ by the write clock synchronization circuit 27 and are output to the read/write buses 16 via the write data output circuit 28.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
an output signal line; and
first and second tristate buffer circuits each having an output node connected to the output signal line in common,
wherein the output signal line includes a first section having first and second connection points, a second section having third and fourth connection points, a third section connected between the first and third connection points, and a fourth section connected between second and fourth connection points,
wherein at least a part of the first section of the output signal line is located on the first tristate buffer circuit, and
wherein at least a part of the second section of the output signal line is located on the second tristate buffer circuit.

2. The apparatus of claim 1,
wherein the first tristate buffer circuit includes a first transistor of a first conductivity type and a second transistor of a second conductivity type, and
wherein the second connection point is located between the first and second transistors in a plan view.

3. The apparatus of claim 2,
wherein the second tristate buffer circuit includes a third transistor of the first conductivity type and a fourth transistor of the second conductivity type, and
wherein the fourth connection point is located between the third and fourth transistors in a plan view.

4. The apparatus of claim 3,
wherein the first connection point is located on an opposite side to the second connection point with respect to the second transistor in a plan view, and wherein the third connection point is located on an opposite side to the fourth connection point with respect to the fourth transistor in a plan view.

5. The apparatus of claim 4, wherein each of the second and fourth transistors is greater in area than each of the first and third transistors.

6. The apparatus of claim 5,
wherein each of the first and third transistors comprises an N-channel MOS transistor, and
wherein each of the second and fourth transistors comprises a P-channel MOS transistor.

7. The apparatus of claim 6,
wherein the first and second transistors are arranged in a first direction,
wherein the third and fourth transistors are arranged in the first direction,
wherein the first and third transistors are arranged in a second direction, and
wherein the second and fourth transistors are arranged in the second direction.

8. The apparatus of claim 7,
wherein the first section of the output signal line extends in the first direction along the first and second transistors, and
wherein the second section of the output signal line extends in the first direction along the third and fourth transistors.

9. The apparatus of claim 8, further comprising third and fourth tristate buffer circuits each having an output node connected to the output signal line in common,
wherein the output signal line further includes a fifth section having a fifth connection point, a sixth section having a sixth connection point, and a seventh section connected between fifth and sixth connection points,
wherein at least a part of the fifth section of the output signal line is located on the third tristate buffer circuit, and
wherein at least a part of the sixth section of the output signal line is located on the fourth tristate buffer circuit.

10. The apparatus of claim 9,
wherein the third tristate buffer circuit includes a fifth transistor comprising an N-channel MOS transistor and a sixth transistor comprising a P-channel MOS transistor,
wherein the fourth tristate buffer circuit includes a seventh transistor comprising an N-channel MOS transistor and an eighth transistor comprising a P-channel MOS transistor,
wherein the fifth connection point is located between the fifth and sixth transistors in a plan view, and
wherein the sixth connection point is located between the seventh and eighth transistors in a plan view.

11. The apparatus of claim 10,
wherein the first connection point is located on an opposite side to the fifth connection point with respect to the sixth transistor in a plan view, and
wherein the third connection point is located on an opposite side to the sixth connection point with respect to the eighth transistor in a plan view.

12. The apparatus of claim 11,
wherein the first, second, fifth, and sixth transistors are arranged in the first direction,
wherein the third, fourth, seventh, and eighth transistors are arranged in the first direction,
wherein the fifth and seventh transistors are arranged in the second direction, and
wherein the sixth and eighth transistors are arranged in the second direction.

13. The apparatus of claim 12,
wherein the fifth section of the output signal line extends in the first direction along the fifth and sixth transistors, and
wherein the sixth section of the output signal line extends in the first direction along the seventh and eighth transistors.

14. An apparatus comprising:
first, second, third, and fourth transistors configured to be exclusively brought into an ON state;
first, second, third, and fourth signal lines connected to and formed on the first, second, third, and fourth transistors, respectively, and
an output node,
wherein an output signal driven by the first transistor is transferred from the first signal line to the output node through the second and fourth signal lines in parallel.

15. The apparatus of claim 14, wherein an output signal driven by the third transistor is transferred from the third signal line to the output node through the second and fourth signal lines in parallel.

16. The apparatus of claim 15, wherein each of the second and fourth signal lines is greater in length than the first and third signal lines.

17. The apparatus of claim 16,
wherein each of the first and third transistors comprises an N-channel MOS transistor, and
wherein each of the second and fourth transistors comprises a P-channel MOS transistor.

18. The apparatus of claim 17,
wherein the first and second transistors are arranged in a first direction,
wherein the third and fourth transistors are arranged in the first direction,
wherein the first and third transistors are arranged in a second direction, and
wherein the second and fourth transistors are arranged in the second direction.

19. The apparatus of claim 18,
wherein the first and second transistors are connected in series to form a first inverter circuit, and
wherein the third and fourth transistors are connected in series to form a second inverter circuit.

20. The apparatus of claim 19,
wherein the first inverter circuit is configured to be controlled by a first clock signal and a first data signal,
wherein the second inverter circuit is configured to be controlled by a second clock signal and a second data signal,
wherein the first and second clock signals are different in phase from each other, and
wherein the first and second data signals are supplied in parallel.

* * * * *